(12) United States Patent
Mishra et al.

(10) Patent No.: US 10,289,579 B2
(45) Date of Patent: May 14, 2019

(54) DIGITAL AGGREGATION OF INTERRUPTS FROM PERIPHERAL DEVICES

(71) Applicant: QUALCOMM Incorporated, San Diego, CA (US)

(72) Inventors: Lalan Jee Mishra, San Diego, CA (US); Richard Dominic Wietfeldt, San Diego, CA (US); Peter Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 238 days.

(21) Appl. No.: 14/965,511

(22) Filed: Dec. 10, 2015

(65) Prior Publication Data

US 2017/0168967 A1 Jun. 15, 2017

(51) Int. Cl.
*G06F 13/24* (2006.01)
*G06F 13/10* (2006.01)
*H03M 1/78* (2006.01)

(52) U.S. Cl.
CPC ............ *G06F 13/24* (2013.01); *G06F 13/102* (2013.01); *H03M 1/785* (2013.01)

(58) Field of Classification Search
CPC .............................. G06F 13/102; H03M 1/785
See application file for complete search history.

(56) References Cited

U.S. PATENT DOCUMENTS

| | | | | |
|---|---|---|---|---|
| 3,810,157 A | * | 5/1974 | Kallio ................... | H03M 1/785 341/127 |
| 4,138,680 A | * | 2/1979 | De Lorme ............. | G01S 1/308 342/396 |
| 5,414,862 A | | 5/1995 | Suzuki et al. | |
| 5,608,348 A | * | 3/1997 | Kearney ................ | G05F 3/265 327/538 |
| 6,002,354 A | * | 12/1999 | Itoh ........................ | H03M 1/68 341/144 |
| 6,048,087 A | * | 4/2000 | Laurent ................ | A61J 7/0084 221/2 |

(Continued)

FOREIGN PATENT DOCUMENTS

| JP | S60 68450 A | * | 4/1985 |
|---|---|---|---|
| JP | S6068450 A | | 4/1985 |

(Continued)

OTHER PUBLICATIONS

"Tutorial—Analog input for multiple buttons—Part Two-Birds on the wire," Jul. 28, 2015, retrieved from internet, URL: https://web.archieve.org/web/20120306013401/http://blog.littlebirdelectronics.co./tutorial-analog-input-for-multiple-buttons-pa, 3 pages.

(Continued)

*Primary Examiner* — Farley Abad
*Assistant Examiner* — Henry W Yu
(74) *Attorney, Agent, or Firm* — Haynes and Boone, LLP (36340)

(57) ABSTRACT

A host integrated circuit is provided with an interrupt aggregator having a signal terminal for coupling to the signal end of an R-2R resistor ladder that has a plurality of rungs corresponding to a plurality of peripheral devices. The interrupt aggregator is configured to process a voltage signal received at the signal terminal to identify any of the peripheral device that intend to trigger an interrupt to a processor.

16 Claims, 4 Drawing Sheets

(56) References Cited

U.S. PATENT DOCUMENTS

| | | | | |
|---|---|---|---|---|
| 6,570,523 | B1* | 5/2003 | Bacrania | H03M 1/165 341/154 |
| 6,963,194 | B2* | 11/2005 | Wu | G01R 19/255 324/76.11 |
| 6,970,752 | B1* | 11/2005 | Lim | H03M 11/24 381/123 |
| 7,142,140 | B2* | 11/2006 | Storvik | H02M 3/157 341/141 |
| 7,446,691 | B2 | 11/2008 | Paul | |
| 8,135,884 | B1* | 3/2012 | Sullam | G06F 13/24 710/266 |
| 2005/0159126 | A1* | 7/2005 | Wang | H03M 11/24 455/226.4 |
| 2013/0335248 | A1* | 12/2013 | Iadanza | H03M 1/785 341/154 |
| 2015/0303983 | A1* | 10/2015 | Lee | H04B 1/525 455/83 |

FOREIGN PATENT DOCUMENTS

| | | |
|---|---|---|
| JP | H04170112 A | 6/1992 |
| JP | H07135468 A | 5/1995 |
| JP | 2004260603 A | 9/2004 |

OTHER PUBLICATIONS

International Search Report and Written Opinion—PCT/US2016/058715—ISA/EPO—Jan. 31, 2017.

Karadimas D.S., et al., "A Digitally Calibrated R-2R Ladder Architecture for High Performance Digital-to-Analog Converters", IEEE International Symposium on Circuits and Systems, Island of Kos, Greece, IEEE Piscataway, NJ, USA, May 21, 2006, XP032458822, pp. 4781-4782.

* cited by examiner

DIGITAL AGGREGATION OF INTERRUPTS FROM PERIPHERAL DEVICES

TECHNICAL FIELD

This application relates to integrated circuit signaling, and more particularly to a digital aggregation of interrupts from peripheral devices.

BACKGROUND

A host integrated circuit such as a system-on-a-chip (SoC) is typically integrated with a plurality of peripheral devices that can each trigger an interrupt to the SoC's processor. To accommodate the interrupt processing, a general purpose input/output (GPIO) architecture may be used in which the SoC includes a unique GPIO pin for each peripheral device's interrupt signal. The SoC then determines immediately the identity of the interrupting peripheral through the identity of the corresponding GPIO pin. Although interrupt processing latency is thus reduced, direct GPIO embodiments suffer from the resulting increased pin count as the SoC must then have a dedicated GPIO pin for each peripheral device.

The SoC pin count may be reduced at the cost of increasing latency in a conventional open-drain embodiment for a host integrated circuit in which the interrupts from a plurality of peripheral devices are all aggregated onto a common pin to the SoC. The default state of the common pin is typically logic high such as through a weak pull-up device. Should a peripheral device want to trigger an interrupt through the common pin, the peripheral device overcomes the weak pull-up device to discharge the common pin voltage to ground. Although just a single common pin can thus service multiple peripherals in an open-drain implementation, the SoC must then poll the peripheral devices to determine which device originated the interrupt, which increases interrupt processing latency.

To reduce interrupt latency, a row-column matrix approach may be used in which the peripheral devices are arranged with regard to a matrix of row and column wires or signal leads. Each peripheral device couples to between a corresponding row and column lead. For example, a matrix of leads formed into three rows and three columns may couple to nine peripheral devices. A first peripheral device couples to the intersection of a first row and a first column, a second peripheral device couples to the intersection of the first row and a second column, and so on such that a ninth peripheral device couples to the intersection of a third row and a third column. Each row couples to a corresponding GPIO pin on the host device. Similarly, each column couples to a corresponding GPIO pin on the host device. In a matrix having m columns and n rows, the host device would thus need to devote the sum of (m+n) GPIO pins for coupling to the matrix. Although the number of necessary GPIO pins is reduced as compared to a direct GPIO architecture, row-column matrix architectures still consume a substantial number of GPIO pins. Moreover, only two peripheral devices may trigger an interrupt at any given time as additional interrupts from other peripheral devices cannot be uniquely identified in a row-column matrix approach. Finally, the processing of the row and column GPIO signals at the host device is complex and consumes substantial power.

Accordingly, there is a need in the art for digital input aggregation architectures that accommodate the processing of interrupts from multiple peripheral devices with reduced latency and also reduced pin count.

SUMMARY

An interrupt aggregator is provided for a host integrated circuit to aggregate any interrupts from a plurality of peripheral devices. The interrupt aggregator couples to a signal end of an R-2R resistor ladder through a host integrated circuit signal terminal. Similarly, the interrupt aggregator couples to a ground end of the R-2R resistor ladder through a host integrated circuit ground terminal. The R-2R resistor ladder has a plurality of rungs corresponding to the plurality of peripheral devices. Each peripheral device couples to the R-2R resistor ladder through its corresponding rung. In a default state, each peripheral device charges its rung of the R-2R ladder to a reference voltage. Should a peripheral device need to trigger an interrupt to a processor, the peripheral device grounds its rung. Each peripheral device thus may be represented by a corresponding interrupt bit having a binary value of zero or one that depends on whether the peripheral device is in the default or interrupting state. There is thus a plurality of interrupt bits corresponding to the plurality of peripheral devices.

The interrupt aggregator includes an analog-to-digital converter configured to digitize an interrupt signal derived from a voltage of the signal terminal to recover the interrupt bits responsive to whether each peripheral device is in the default state or the interrupting state. The interrupt aggregator is configured to process the interrupt bits to identify whether at least one of the peripheral devices is in the interrupting state. Should the identification be positive, the interrupt aggregator is configured to interrupt the processor with the identity of the at least one peripheral devices in the interrupting state.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

Figure 1A:
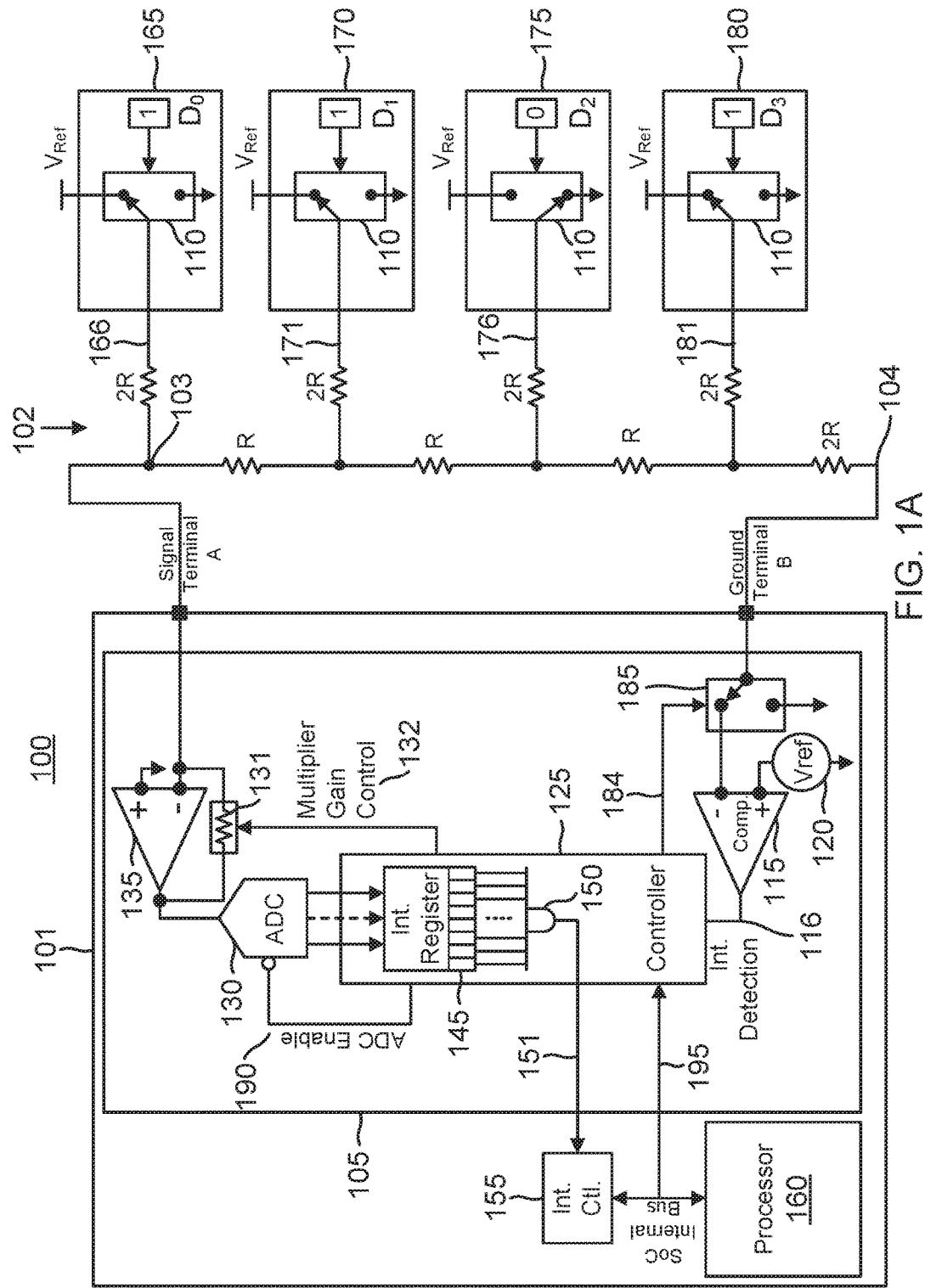
FIG. 1A illustrates an example integrated interrupt aggregation system having a single resistor ladder in accordance with an aspect of the disclosure.

To reduce pin count and interrupt processing latency, a host integrated circuit is provided that aggregates one or more interrupts from a plurality of peripheral devices through an external R-2R ladder network onto a host integrated circuit signal terminal. After aggregating the interrupts, the host integrated circuit proceeds to trigger an interrupt to a processor and to provide the processor with the identity of the interrupting one (or ones) of the peripheral devices. The interrupted processor may be integrated within the host integrated circuit such as in a system-on-a-chip (SoC). Such an embodiment is designated herein as an integrated interrupt aggregation system. Alternatively, the processor may be located separately from the host integrated circuit in what is denoted herein as a distributed interrupt aggregation system. For example, the host integrated circuit may be a power management integrated circuit (PMIC) that aggregates the intended interrupts from the peripheral devices and triggers an interrupt to a processor in an SoC and also identifies the interrupting one (or ones) of the peripheral devices to the processor.

Each peripheral device couples to the R-2R resistor ladder through a corresponding rung or terminal. There is thus a unique rung on the R-2R resistor ladder for each peripheral device. Each peripheral device has a default state in which the peripheral device does not intend to trigger an interrupt to a processor. While in the default state, each peripheral device is configured to charge its rung of the R-2R resistor ladder to a reference voltage such as a power supply voltage that is the substantially the same for all the peripheral devices. Conversely, each peripheral device has an interrupt state in which the peripheral device intends to trigger an interrupt to the processor. While in the interrupt state, each peripheral device is configured to ground its rung of the R-2R resistor ladder. For example, a peripheral device may include a sensor that has sensed a condition that the processor needs to be alerted to through an interrupt. The corresponding peripheral device would then change from its default state of charging its rung of the R-2R resistor ladder to grounding its rung. Advantageously, the interrupt aggregation discussed herein can uniquely identify each such interrupting peripheral device regardless of how many peripheral devices at any given time are in the default state or have transitioned into the interrupting state. Moreover, this identification of all interrupting peripheral devices requires just two pins or terminals at the host integrated circuit for coupling to the two ends of the R-2R resistor ladder.

With regard to the ends of the R-2R resistor ladder, there is a signal end and a ground end. The host integrated circuit includes a signal terminal for coupling to the signal end of the R-2R resistor network and a ground terminal for coupling to the ground end of the R-2R resistor network. When all the peripheral devices are in the default state, both the ground end and the signal end of the R-2R resistor ladder are charged to the reference voltage. Should a peripheral device transition into the interrupting state, it proceeds to ground its rung of the R-2R resistor ladder. This grounding reduces the voltage of the signal end and the ground end of the R-2R resistor ladder from the reference voltage. The host integrated circuit is configured to monitor the voltage of its ground terminal to detect this voltage change. Should the host integrated circuit detect that its ground terminal has dropped below the reference voltage, it proceeds to ground its ground terminal so as to ground the ground end of the R-2R resistor ladder. If all the peripheral devices are in the default state, the host integrated circuit couples its ground terminal to a high-impedance input of a differential amplifier to monitor the ground terminal voltage for any subsequent transitions of the peripheral devices into the interrupting state.

The plurality of peripheral devices may include a positive integer n of such peripheral devices, n being a positive integer. The R-2R resistor ladder thus has n rungs for coupling to the n peripheral devices. In addition, the interrupt or default state of each peripheral device may be represented by a corresponding interrupt bit. For example, the value of the interrupt bit may be deemed to equal a binary one if the corresponding peripheral device is in the default state and to equal a binary zero if the corresponding peripheral device is in the interrupting state. Given this binary representation, the voltage at the signal end of the R-2R resistor ladder equals a binary-weighted sum of the interrupt bits from the peripheral devices. For example, the peripheral devices may be deemed to be arranged from a zeroth peripheral device to an (n−1)th peripheral device. The corresponding interrupt bits from the peripheral devices may thus be deemed to range from a bit $D_0$, to a bit $D_1$, a bit $D_2$, and so on up to a final bit $D_{n-1}$. The host integrated circuit may include a summing amplifier coupled to its signal terminal to sum all the corresponding digital contributions from the peripheral devices to the voltage received at the signal end of the R-2R ladder. The summing amplifier includes a summing amplifier having an output and a negative input coupled through a feedback resistor $R_f$ having a resistance of $R_f$. Note that the output impedance of the R-2R resistor ladder is always R regardless of how many peripheral devices are in the interrupting state or in the default state. It may thus be shown that the summed analog voltage Vout from the summing amplifier may be represented by the following Equation 1:

$$Vout = (R_f/R)*(D_0/2 + D_1/4 + \ldots + D_{n-1}/2^n) \qquad \text{Eq. 1}$$

As can be derived from Equation 1, the digital voltage contribution from the ith peripheral device is proportional to the ratio $D_i/2^{i+1}$. This ith interrupt bit is a binary 0 if the corresponding peripheral device is in the interrupting state and is binary 1 if the corresponding peripheral device is in the default (non-interrupting) state. The host integrated circuit may also include an analog-to-digital converter (ADC) that digitizes the analog voltage to recover the interrupt bits $D_0$ through $D_{n-1}$. The identity of the interrupting peripheral devices is thus immediately given through the binary value of the corresponding interrupt bit from the analog-to-digital converter. This is quite advantageous as the host integrated circuit requires only two pins or terminals for coupling to the R-2R resistor ladder yet there is relatively little latency and power consumption through the resulting summing and digitization in the host integrated circuit. The host integrated circuit may then proceed to generate an interrupt to the processor and also provide the identity of the corresponding interrupting peripheral device or devices to the processor. In some embodiments, a single interrupt command may be used that is n-bits wide to provide both the interrupt and the identity of the interrupting peripheral devices to the processor. Alternatively, the host integrated circuit may separately interrupt the processor and provide the identity of the interrupting peripheral devices. Turning now to the drawings, an example integrated interrupt aggregation system will be discussed followed by a discussion of an example distributed interrupt aggregation system.

Integrated Interrupt Aggregation System

An example integrated interrupt aggregation system 100 is shown in FIG. 1A. As discussed previously, an integrated interrupt processing system is one in which a host integrated circuit 101 also includes a processor 160 for which the interrupts are being aggregated. An R-2R resistor ladder 102 has a signal end 103 that couples to a signal terminal A on host integrated circuit 101. Similarly, R-2R resistor ladder 102 has a ground end 104 that couples to a ground terminal B on host integrated circuit 101. As known in the R-2R resistor ladder arts, R-2R ladder 102 has a plurality of resistors R and a plurality of resistors 2R. Each resistor R has a resistance of R ohms whereas the resistance for the 2R resistors is 2R ohms. For example, if each resistor R has a resistance of 10K Ω, then each resistor 2R has a resistance of 20K Ω.

In the illustrated example, a zeroth peripheral device 165 couples to a zeroth rung 166 of R-2R resistor ladder 102. Similarly, a first peripheral device 170 couples to a first rung 171 of R-2R resistor ladder 102. A second peripheral device 175 couples to a second rung 176 of R-2R resistor ladder 102. Finally, a third and final peripheral device 180 couples to a third and final rung 181 of resistor ladder 102. Each rung includes a 2R resistor that may be integrated onto a circuit board or within the corresponding peripheral device. As known in the R-2R resistor ladder arts, R-2R resistor ladder 102 includes a serial combination of resistors R from signal end 103 that couple to a final resistor 2R at ground end 104. Since system 100 includes a plurality n=4 of peripheral devices, there are three serially-arranged resistors R coupled to signal end 103. In general, there are n−1 such resistors R for an embodiment having n peripheral devices. It will be appreciated that the actual number of rungs and corresponding peripheral devices for alternative embodiments may be more or less than the example of four used in system 100.

As discussed previously, each peripheral device in system 100 has a binary state that depends upon whether the peripheral device is in the interrupting state or in the default state. It is arbitrary whether the default state is represented by a binary one (in which case the interrupting state is represented by a binary zero) or whether the default state is represented by a binary zero (in which case the interrupting state is represented by a binary one) so long as the same convention is used for each peripheral device. It will thus be appreciated that a convention of using an interrupt bit equaling binary one to represent the default state for each peripheral device is used in system 100 without loss of generality. Each peripheral device may include a three-terminal switch 110 that is controlled by the corresponding interrupt bit. Each three-terminal switch 110 is configured to couple the corresponding rung of R-2R ladder 102 to either a node supplying a reference voltage ($V_{Ref}$) or to ground. In one embodiment, the reference voltage may equal a power supply voltage. Alternatively, the reference voltage may be derived, for example, from a band gap circuit. In the default state for the corresponding peripheral device, each three-terminal switch 110 couples the corresponding rung to the $V_{Ref}$ node. In system 100, peripheral devices 165, 170, and 180 are all in the default state as represented by a binary value of one.

As discussed earlier, the binary state for zeroth peripheral device 165 that identifies whether zeroth peripheral device is in the default or interrupting state is represented by an interrupt bit $D_0$, which controls the corresponding 3-terminal switch 110. In system 100, interrupt bit $D_0$ thus equals a binary one. Similarly, the binary value for first peripheral device 170 is represented by an interrupt bit $D_1$ that equals a binary one as well since first peripheral device 170 is in the default state. Moreover, the binary value for third peripheral device 180 is represented by an interrupt bit $D_3$ that equals a binary one since third peripheral device 180 is also in the default (non-interrupting) state.

With regard to peripheral device 175, an appropriate event or triggering condition has occurred to cause peripheral device 175 to transition to the interrupting state in so as to trigger an interrupt to processor 160. For example, peripheral device 175 may include a WiFi device that has received a message to which processor 160 must respond. Alternatively, peripheral device 175 may include a sensor that has sensed an alert condition to which processor 160 must respond as first triggered through an interrupt. Regardless of the specific triggering condition, peripheral device 175 is in the interrupting state such that its corresponding interrupt bit $D_2$ equals a binary zero. Interrupt bit $D_2$ thus causes 3-terminal switch 110 in peripheral device 175 to ground corresponding rung 176.

To identify which peripheral devices are in the interrupting state, host integrated circuit 101 includes an interrupt aggregator 105 that processes the voltages for signal terminal A and for ground terminal B. Note that prior to any triggering condition such as the one discussed with regard to peripheral device 175, all the peripheral devices were in the default state such that each peripheral device charged its corresponding rung to the reference voltage. If both signal terminal A and ground terminal B have a high-input impedance at that time, both these terminals are then charged to the reference voltage. Interrupt aggregator 105 includes a summing amplifier 135 having a negative input coupled to terminal A. As known in the summing amplifier arts, summing amplifier 135 may comprise an operational amplifier or other suitable amplifier having a relatively high-input impedance such that terminal A is readily charged to the reference voltage when all the peripheral devices are in the default state.

With regard to ground terminal B, interrupt aggregator 105 may include a three-terminal switch 185 that may either couple ground terminal B to ground or to an input (for example, the negative input) of a differential amplifier 115. Interrupt aggregator 105 includes a controller 125 configured to control the switching state of three-terminal switch 185 through a control signal 184. During a default state for controller 125, control signal 184 commands three-terminal switch 185 to couple ground terminal B to the negative input of a differential amplifier 115. Differential amplifier 115 may comprise an operational amplifier or other suitable amplifier that provides a relatively high-input impedance to ground terminal B when all the peripheral devices are in their default state. A reference voltage source 120 provides the reference voltage to a positive input of differential amplifier 115 such that an interrupt detection output signal 116 from differential amplifier 115 is asserted low to ground while all the peripheral devices are in their default state.

In response to a triggering condition, the corresponding peripheral device may ground its rung of R-2R ladder 102 so as to cause the voltage of ground terminal B to drop below the reference voltage. As discussed earlier, peripheral device 175 has responded to a triggering condition and has thus grounded its rung 176. The interrupt detection output signal 116 will then be asserted high such as to a power supply voltage. Controller 125 is configured to respond to this assertion by driving control signal 184 such that three-terminal switch 185 grounds ground terminal B. Interrupt aggregator 105 may then proceed to aggregate the intended interrupts from any peripheral devices in the interrupting state such as from peripheral device 175.

To perform this aggregation, summing amplifier 135 sums the digital contributions from each peripheral device analogously as discussed with regard to Equation 1. A resistor 131 provides the feedback resistance Rf discussed with regard to Equation 1. Controller 125 responds to the assertion of interrupt detection signal 116 by enabling an analog-to-digital converter (ADC) 130 through an ADC enable signal 190. ADC 130 is configured to digitize the summed voltage from summing amplifier 135 into the interrupt bits $D_0$, $D_1$, $D_2$, and $D_3$ that identify whether the corresponding peripheral devices are in the default or interrupting state. In system 100, all these interrupt bits are a binary one except for interrupt bit $D_2$ being a binary zero. Controller 125 may include an interrupt register 145 for storing the interrupt bits. Controller 125 may further include a logic gate such as an AND gate 150 for processing the interrupt bits to determine whether any interrupt bit equals a binary zero. When all the peripheral devices are in the default state, an output signal 151 of AND gate 150 equals a binary one. However, since peripheral device 175 is in the interrupting state, output signal 151 is a binary zero. In one embodiment, AND gate 150 forms a means for processing the interrupt bits to identify whether at least one of the peripheral devices is in the interrupt state. An interrupt control interface 155 responds to output signal 151 equaling a binary zero by triggering an interrupt of processor 160 over an internal bus 195. Controller 125 may also drive the contents of interrupt registers 145 over internal bus 195 to processor 160 so that processor 160 may be apprised of the identity of the peripheral device (or devices) that have triggered the interrupt. After processor 160 has responded to the interrupt, controller 125 then drives three-terminal switch 185 back into its default state in which ground terminal B is coupled to an input of differential amplifier 115.

The required resolution of ADC 130 is a function of how many interrupt bits it must digitize. In system 100 there are just four interrupt bits such that the required resolution is relatively relaxed. As the number of peripheral devices is increased, the resolution demands may be eased on ADC 130 by implementing feedback resistor 131 as a variable feedback resistor controlled by a multiplier gain control signal 132 from controller 125. Referring again to Equation 1, note that the feedback resistance is a multiplier of the summed voltage. The interrupt bits range from the least significant zeroth bit $D_0$ to the most significant bit $D_{n-1}$. The more significant interrupt bits are subject to progressively higher division in Equation 1 such that the feedback resistance may be increased so as to better distinguish these bits should ADC 130 have insufficient resolution. In this fashion, costs may be lowered by using a relatively low resolution ADC 130 yet all the interrupt bits may be distinguished.

Figure 1B:
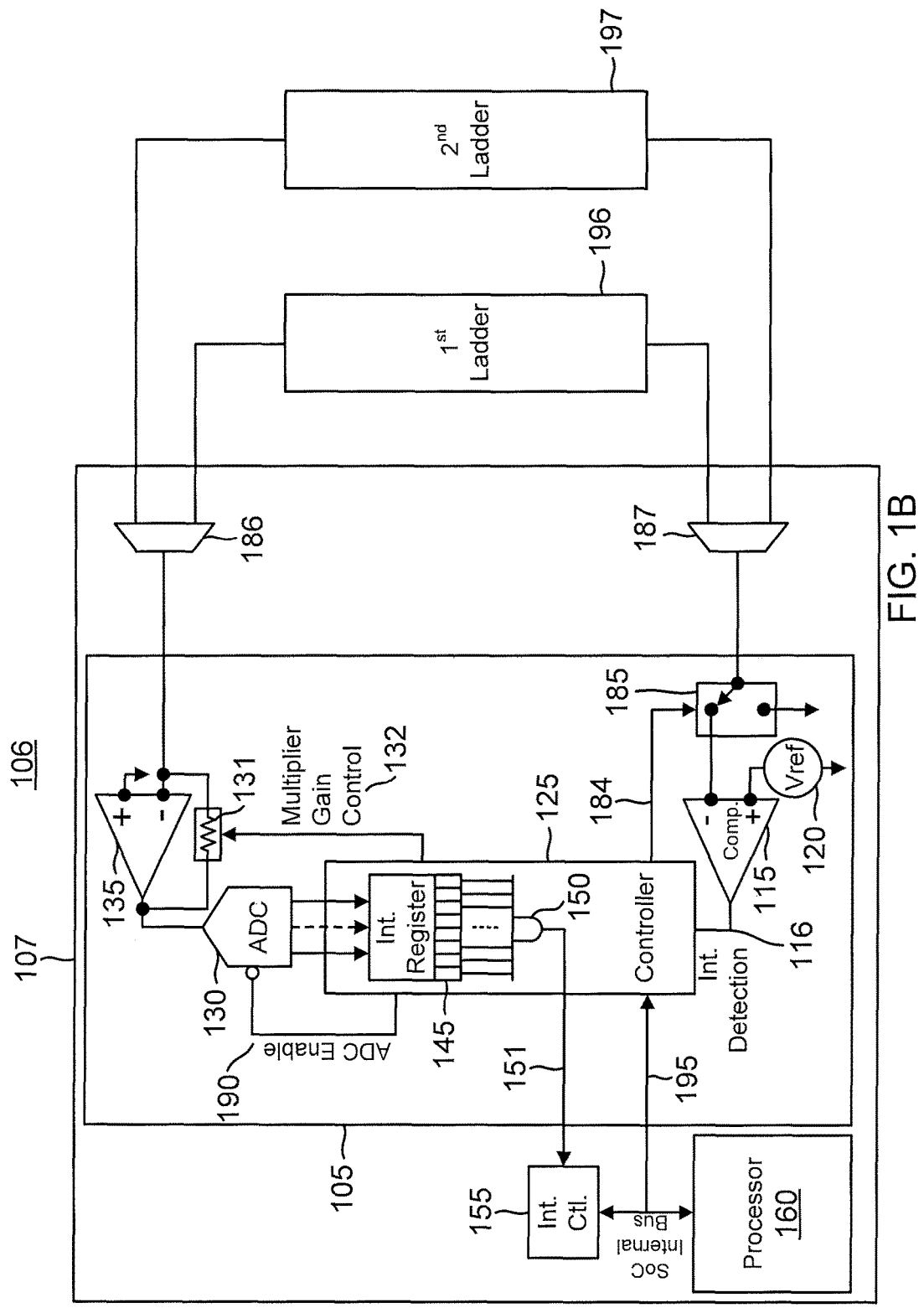
FIG. 1B illustrates an example integrated interrupt aggregation system having a pair of resistor ladders in accordance with an aspect of the disclosure.

As the number of peripheral devices is increased for alternative embodiments, the resolution of ADC 13.0 must increase accordingly. For example, ADC 130 would need five bits of resolution for an embodiment having thirty-two peripheral devices. But increasing the analog-to-digital conversion resolution increases manufacturing costs. To keep the resolution low, multiple R-2R resistor ladders may be used such as shown in FIG. 1B for a system 106. A host integrated circuit 106 includes an interrupt aggregator 105 that functions as discussed with regard to system 100 of FIG. 1A. In contrast to system 100, interrupt aggregator 105 in system 106 couples to a first R-2R ladder 196 and a second R-2R ladder 197 through a pair of multiplexers 186 and 187. The peripheral devices and resistors for first and second R-2R ladders 196 and 197 are not shown in FIG. 1B for illustration clarity. Multiplexers 186 and 187 are controlled to select for the same R-2R ladder. The splitting of the peripheral devices across multiple R-2R ladders relaxes the resolution requirement for ADC 130. For example, suppose that first and second R-2R ladders 196 and 197 each include eight peripheral devices. Although there would then be sixteen peripheral devices in total, ADC 130 may still have only 3 bits of resolution since interrupt aggregator 105 would monitor only one of R-2R ladders 196 and 197 at any given time. Interrupt aggregator 105 may thus periodically drive multiplexers 186 and 187 so that R-2R ladders 196 and 197 may be analyzed serially. In this fashion, input aggregator 105 may advantageously increase the number of monitored peripheral devices without requiring a corresponding increase in the resolution of ADC 130.

An example distributed interrupt aggregation system will now be discussed.

Example Distributed Interrupt Aggregation System.

Figure 2:
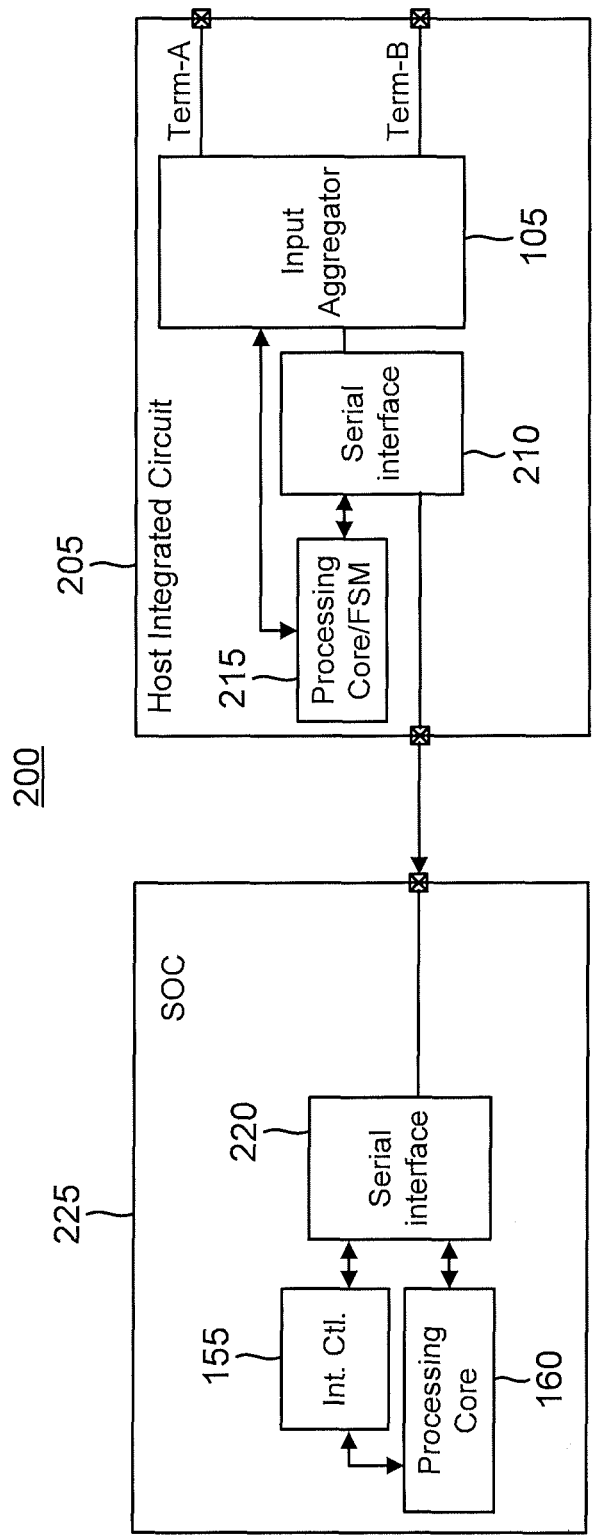
FIG. 2 illustrates an example distributed interrupt aggregation system in accordance with an aspect of the disclosure.

An example distributed interrupt aggregation system 200 is shown in FIG. 2 in which host integrated circuit 205 does not include processor 160 for which the interrupts are being aggregated. For example, host integrated circuit 205 may include a power management integrated circuit (PMIC) that includes an interrupt aggregator 105 as discussed with regard to FIGS. 1A and 1B for coupling to signal terminal A and ground terminal B. The corresponding R-2R resistor ladder and peripheral devices are not shown in FIG. 2 for illustration clarity. Host integrated circuit 205 includes a processor or a finite state machine 215 for controlling a serial interface 210 and interrupt aggregator 105. Serial interface 210 couples to a serial interface 220 in an SoC 225 including processor 160 and interrupt control interface 155. Serial interfaces 210 and 220 may be any suitable interface such as a serial peripheral interface (SPI) or a universal asynchronous receiver/transmitter (UART) interface. In this fashion, interfaces 220 and 210 may accommodate other signaling between host integrated circuit 205 and SoC 225 besides the interrupt aggregation signaling. Should a peripheral device transition to the interrupting state, serial interface 210 transmits a serial frame or frames to serial interface 220 that triggers an interrupt to processor 160 through interrupt control interface 155 and that identifies the interrupting peripheral devices. Interrupt control interface 155 may then proceed to interrupt processor 160 accordingly. An example method of interrupt aggregation will now be discussed.

Interrupt Aggregation Method

Figure 3:
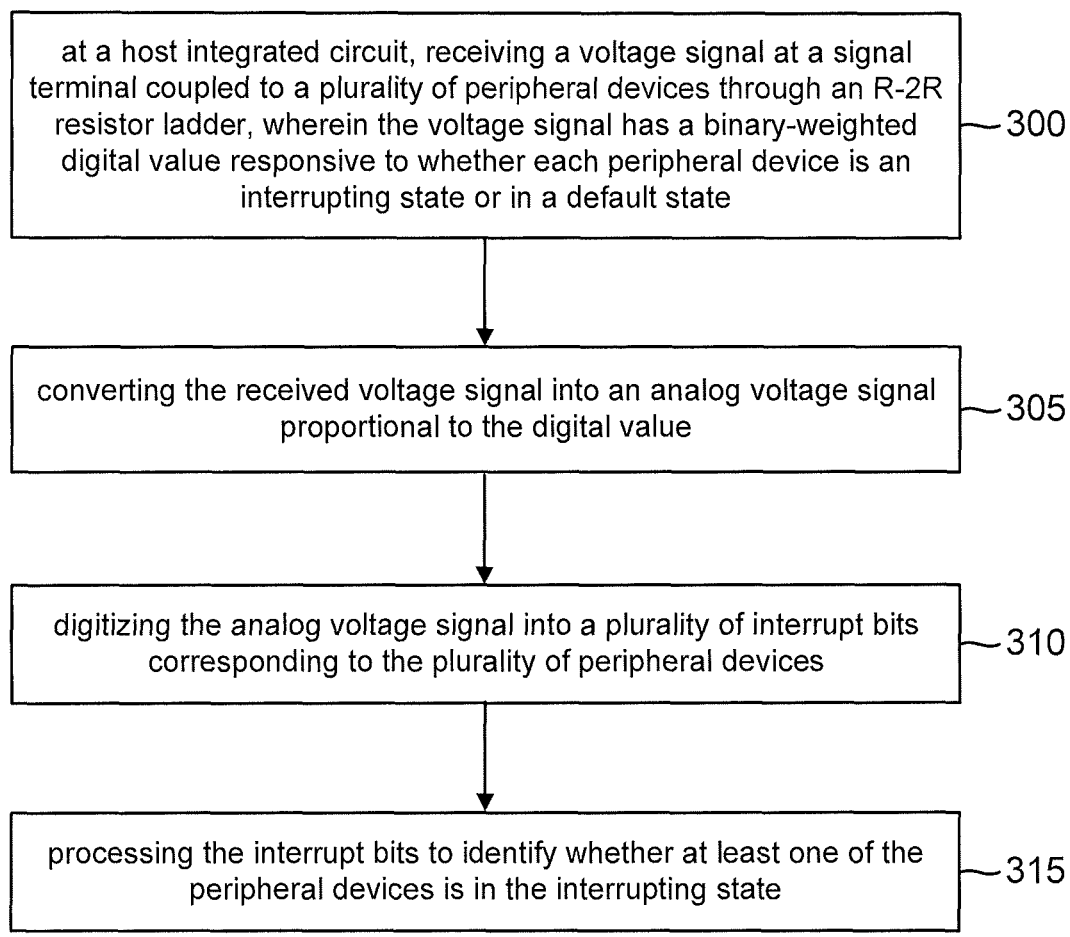
FIG. 3 is a flowchart for an example method of interrupt aggregation in accordance with an aspect of the disclosure.

A flowchart for an interrupt aggregation method such as performed by interrupt aggregator 105 is shown in FIG. 3. The method includes an act 300 performed at a host integrated circuit and includes receiving a voltage signal at a signal terminal coupled to a plurality of peripheral devices through an R-2R resistor ladder, wherein the voltage signal has a binary-weighted digital value responsive to whether each peripheral device is in an interrupting state or in a default state. The receipt of the signal end voltage from R-2R ladder 102 at the signal terminal A in FIG. 1A is an example of act 300. The method also includes an act 305 of converting the received voltage signal into an analog voltage signal proportional to the digital value. The summing in summing amplifier 135 of FIG. 1A is an example of act 305. Furthermore, the method includes an act 310 of digitizing the analog voltage signal into a plurality of interrupt bits corresponding to the plurality of peripheral devices. The digitization of the summing amplifier output voltage in ADC 130 of FIG. 1A is an example of act 310. Finally, the method includes an act 315 of processing the interrupt bits to identify whether at least one of the peripheral devices is in the interrupting state. The processing of the interrupt bits through AND gate 150 of FIG. 1A is an example of act 315.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An integrated circuit, comprising:
an analog-to-digital converter configured to digitize a voltage signal from a signal end of an R-2R resistor ladder into a plurality of interrupt bits corresponding to a plurality of peripheral devices responsive to an interrupt detection, wherein each interrupt bit has a binary value indicative of an interrupt state of a corresponding peripheral device;
a logic circuit configured to process the plurality of interrupt bits to identify whether at least one of the peripheral devices is in the interrupt state;
an interrupt interface configured to interrupt a processor responsive to an identification of the at least one peripheral device in the interrupt state;
a ground terminal for coupling to a ground end of the R-2R resistor ladder;
a differential amplifier configured to compare a voltage of an internal node to a reference voltage to trigger the interrupt detection;
a three-terminal switch configured to couple the ground terminal to the internal node during a default state in which a voltage of the ground end of the R-2R resistor ladder equals the reference voltage; and
a controller configured to drive the three-terminal switch to couple the ground terminal to ground responsive to the voltage of the ground end of the R-2R resistor ladder being less than the reference voltage.

2. The integrated circuit of claim 1, wherein the processor is integrated within the integrated circuit.

3. The integrated circuit of claim 1, wherein the processor is external to the integrated circuit.

4. The integrated circuit of claim 3, further comprising a power management integrated circuit.

5. The integrated circuit of claim 1, further comprising a register configured to store the plurality of interrupt bits.

6. The integrated circuit of claim 1, wherein the logic circuit comprises an AND gate.

7. The integrated circuit of claim 1, wherein the controller is further configured to enable the analog-to-digital converter responsive to the voltage of the internal node being less than the reference voltage.

8. The integrated circuit of claim 1, wherein the reference voltage is a power supply voltage.

9. The integrated circuit of claim 1, further comprising:
a signal terminal; and
a summing amplifier configured to sum a digital contribution from each peripheral device received at the signal terminal to provide the voltage signal.

10. The integrated circuit of claim 9, wherein the summing amplifier includes a variable feedback resistor having a variable feedback resistance, and wherein the controller is further configured to vary the variable feedback resistance.

11. A method, comprising:
during a default state in which no interrupts are generated, charging a voltage of a ground end of an R-2R ladder to a reference voltage;
detecting an interrupt responsive to the voltage of the ground end of the R-2R ladder discharging below the reference voltage;
at a host integrated circuit, receiving a voltage signal from a signal end of an R-2R resistor ladder coupled to a plurality of peripheral devices responsive to the detection of the interrupt, wherein the voltage signal has a binary-weighted digital value responsive to whether each peripheral device is an interrupting state or in a default state;
converting the received voltage signal into an analog voltage signal proportional to the digital value;
digitizing the analog voltage signal into a plurality of interrupt bits corresponding to the plurality of peripheral devices;
processing the interrupt bits to identify whether at least one of the peripheral devices is in the interrupting state; and
grounding the ground end of the R-2R ladder responsive to the voltage of the ground end of the R-2R ladder discharging below the reference voltage.

12. The method of claim 11, further comprising:
interrupting a processor with an identity of the at least one interrupting peripheral device.

13. The method of 12, wherein converting the received voltage signal into an analog voltage signal comprises amplifying the received voltage signal in a summing amplifier.

14. The method of claim 11, wherein processing the interrupt bits comprises a logical AND operation.

15. The method of claim 12, wherein interrupting the processor comprises interrupting the processor within the host integrated circuit.

16. The method of claim 12, wherein interrupting the processor comprises interrupting the processor external to the host integrated circuit.

* * * * *